US012100673B2

(12) United States Patent
Lin et al.

(10) Patent No.: US 12,100,673 B2
(45) Date of Patent: Sep. 24, 2024

(54) CHEMICAL MECHANICAL POLISHING DISHING RESISTANT STRUCTURE

(71) Applicant: TAIWAN SEMICONDUCTOR MANUFACTURING COMPANY, LTD., Hsinchu (TW)

(72) Inventors: Meng-Han Lin, Hsinchu (TW); Chia-En Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 377 days.

(21) Appl. No.: 17/389,870

(22) Filed: Jul. 30, 2021

(65) Prior Publication Data
US 2022/0367387 A1   Nov. 17, 2022

Related U.S. Application Data

(60) Provisional application No. 63/188,185, filed on May 13, 2021.

(51) Int. Cl.
*H01L 23/58*   (2006.01)
*H01L 21/768*   (2006.01)
*H01L 23/00*   (2006.01)

(52) U.S. Cl.
CPC ...... *H01L 23/585* (2013.01); *H01L 21/76802* (2013.01); *H01L 21/76877* (2013.01); *H01L 23/562* (2013.01)

(58) Field of Classification Search
CPC ............. H01L 23/585; H01L 21/76802; H01L 21/76877; H01L 23/562; H01L 23/522; H01L 23/16; H01L 21/56; H01L 23/31; H10B 43/10; H10B 43/27; H10B 43/50
See application file for complete search history.

(56) References Cited

U.S. PATENT DOCUMENTS 11,348,928 B1 *   5/2022   Fackenthal ............ H10B 10/18

* cited by examiner

*Primary Examiner* — Thanh T Nguyen
(74) *Attorney, Agent, or Firm* — Hauptman Ham, LLP

(57) ABSTRACT

A semiconductor device includes a first circuit element over a substrate; a fill material over the substrate and in contact with sides of the first circuit element; and a dishing resistant (DR) structure in the fill material and outside a perimeter of the first circuit element. Some DR structures are dummy structures manufactured in the fill material over the substrate.

20 Claims, 18 Drawing Sheets

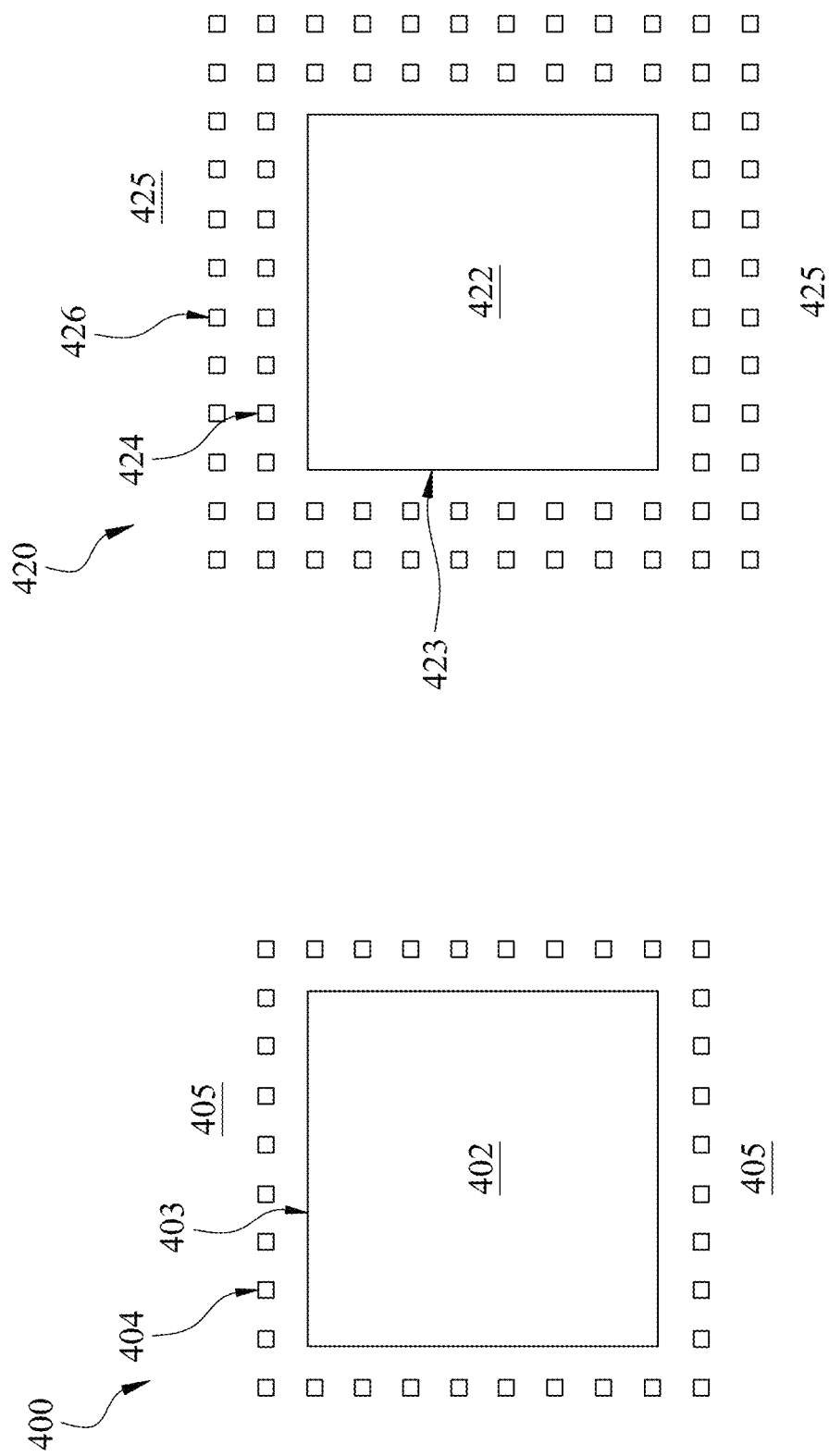

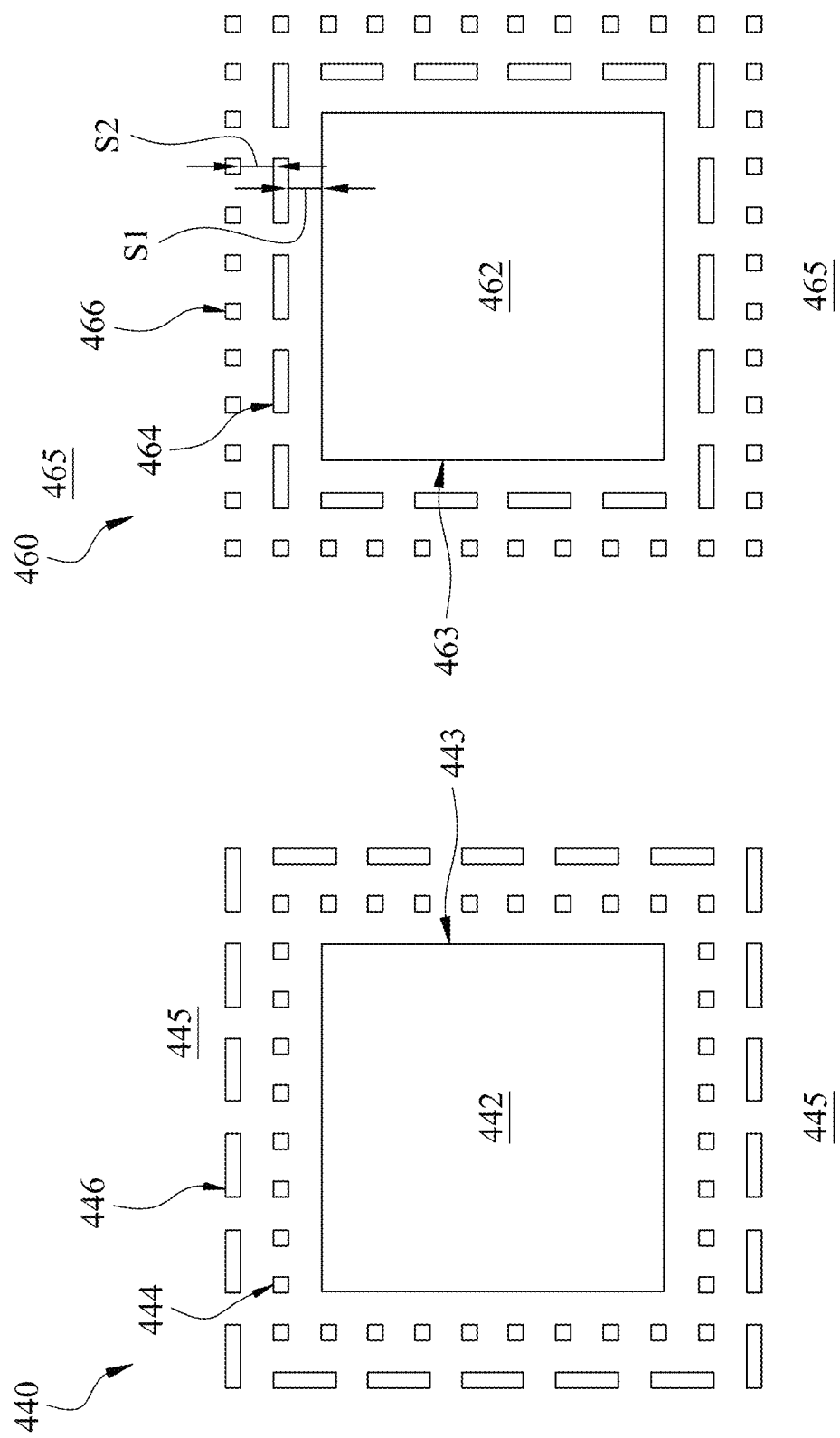

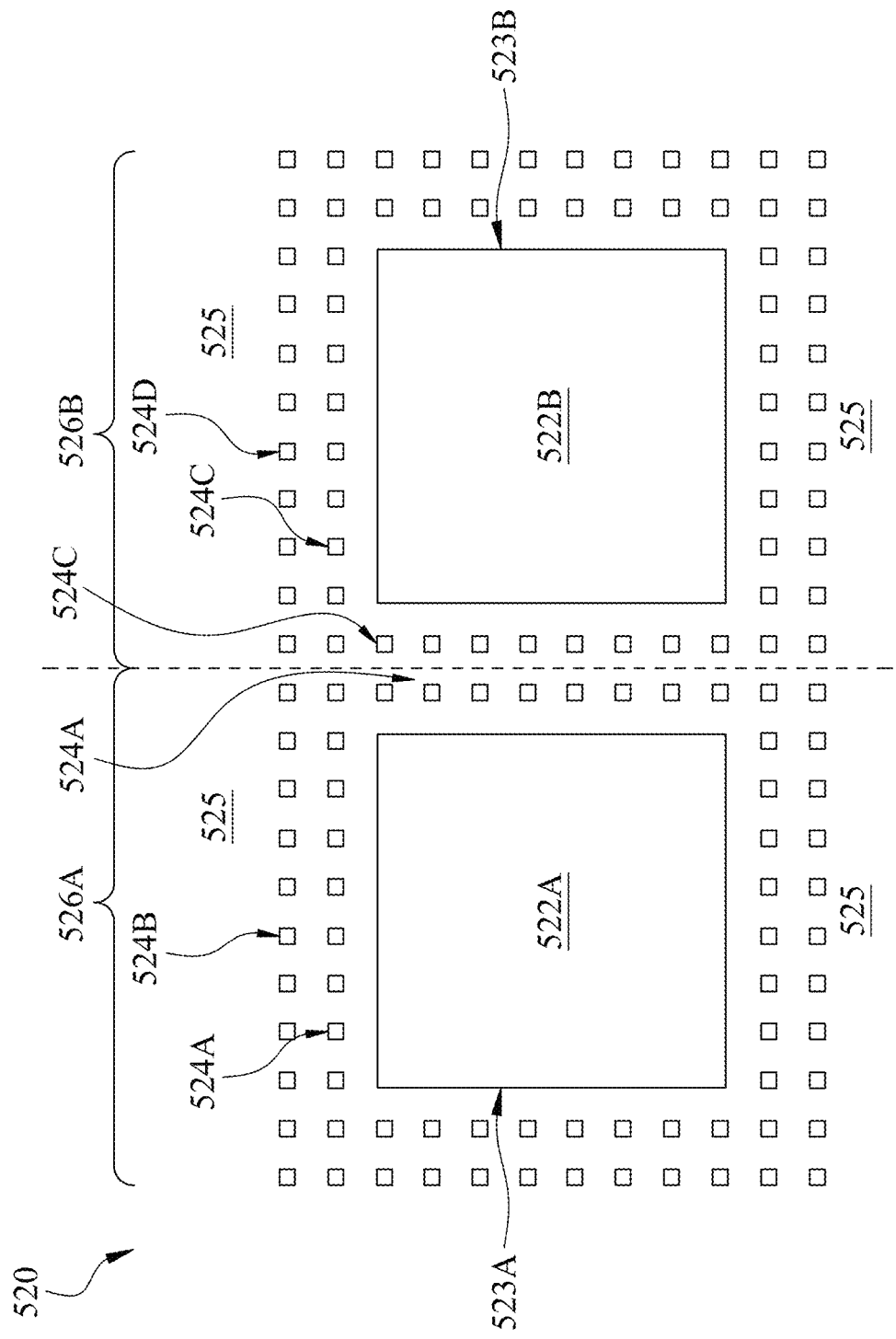

CHEMICAL MECHANICAL POLISHING DISHING RESISTANT STRUCTURE

PRIORITY CLAIM AND CROSS-REFERENCE

This application claims priority to U.S. Provisional Patent Application No. 63/188,185 titled, "THREE-DIMENSIONAL INTEGRATED CIRCUIT (3DIC) AND METHOD OF MAKING" filed on May 13, 2021, which is incorporated herein by reference in its entirety.

BACKGROUND

The manufacture of semiconductor devices involves the deposition of films and the planarization of films, e.g., using chemical mechanical polishing (CMP) operations, to produce surfaces of even thickness for subsequent film deposition. CMP operations create local variations of film thickness (e.g., dishing) when a portion of material is removed at a faster rate than the surrounding material. After subsequent film deposition steps the uneven thickness leads to focusing problems during pattern transfer, and/or overetch or underetch conditions after etch processes are performed on the film deposited over a film with dishing, in some instances.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4E are top views of semiconductor devices during a manufacturing process, in accordance with some embodiments.

FIGS. 5A-5B are top views of semiconductor devices during a manufacturing process, in accordance with some embodiments.

DETAILED DESCRIPTION

Figure 1:
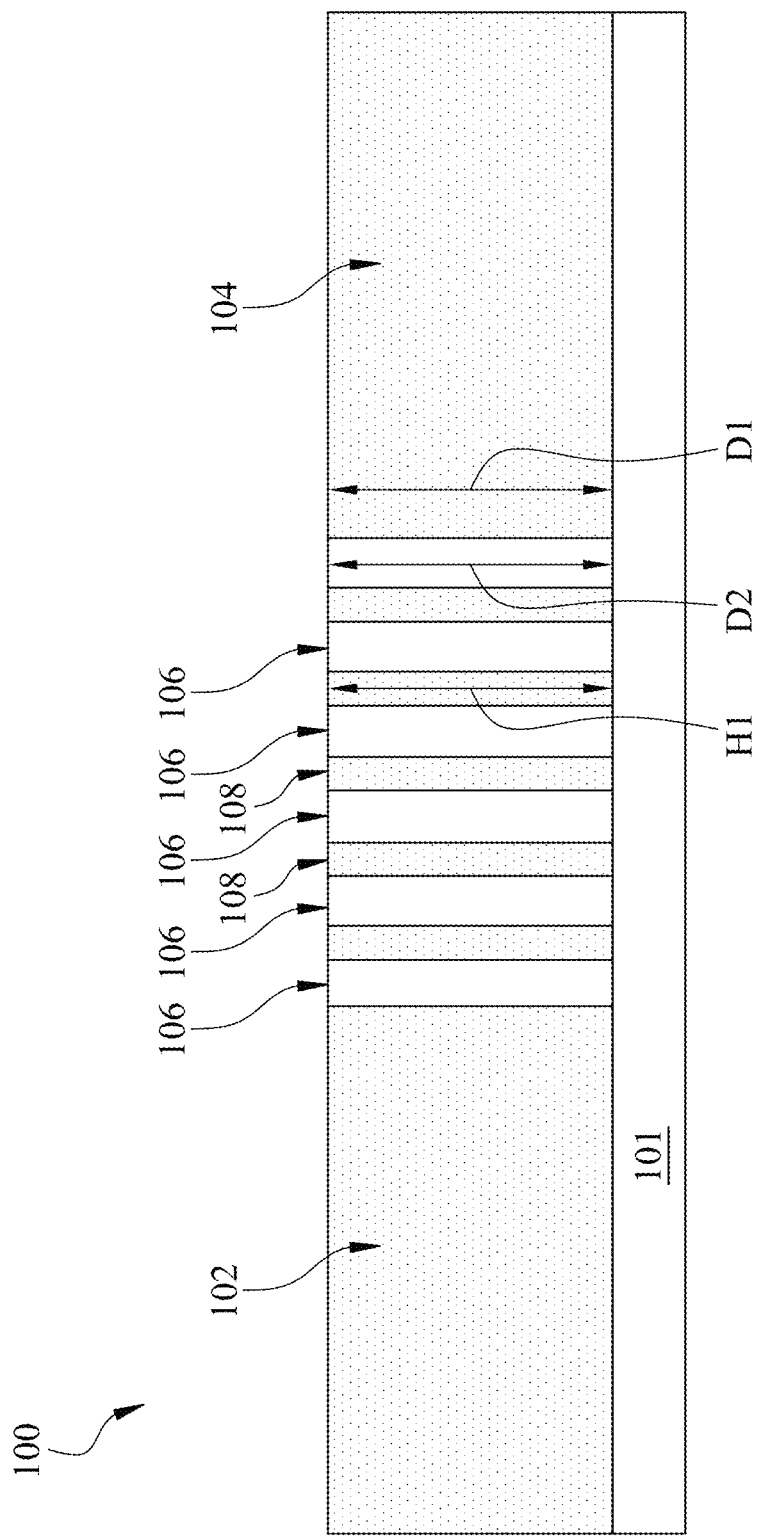
FIG. 1 is a cross-sectional view of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor device manufacturing, vertical dimension control plays a role in producing semiconductor devices with consistent performance. Vertical dimension control of elements of a semiconductor device provides for faster manufacturing processes and manufacturing processes with fewer defects and smaller resistance of interconnect structures in the semiconductor device.

Planarization of layers of a semiconductor device is accomplished by performing chemical mechanical processing (CMP) operations on films deposited to manufacture the semiconductor device. With CMP processes, a semiconductor device manufacturer provides a flat surface for manufacturing subsequent layers of the semiconductor device.

However, planarization of a layer of material in a semiconductor device does not always produce a flat surface. Dishing is a phenomenon whereby a CMP process removes too much material from a layer of material being planarized, producing a low point on the surface. Dishing frequently occurs in open areas of a layer of material where no underlying structures in the layer of material modify the relative hardness of the layer of material. Deposition of a new layer of material over a planarized surface with dishing results in a thickness of the new layer of material which is larger than expected at the location of the dishing or low point in the planarized layer of material below the new layer of material, in some instances.

A layer of material is soft and has a higher likelihood of experiencing dishing during CMP processing when the layer of material is uniform and the area below the layer of material is open and free of structure for the semiconductor device. A layer of material is hard, for purposes of avoiding dishing during CMP processing, when the layer of material contains underlying structures embedded in the layer of material (e.g., contacts, vias, fins, and so forth). Contacts, vias, and conductive lines include conductive material (e.g., metals) which are harder than insulating materials, dielectric materials, or fill material which is added to a semiconductor device over an underlying device structure. Fins often comprise crystalline material (e.g., semiconductor material such as a silicon substrate and the like), which is harder than insulating materials, dielectric materials, or fill material which is added to a semiconductor device. A portion of harder material such as metal or a semiconductor material (with respect to the hardness of the fill material, dielectric material, and so forth) protects a portion of the fill material from dishing by resisting erosion from the CMP process better than the fill material in open areas of the semiconductor device resist erosion. Contacts, vias, conductive lines, and the like are examples of dishing resistant (DR) structures for preventing dishing. The present disclosure relates to adding dummy contacts, dummy vias, dummy conductive lines, and the like around circuit elements of a semiconductor device to reduce dishing of the fill material around the circuit element.

In the present disclosure, a method is described for adding dishing-resistant structures to portions of fill material (e.g., insulating material, dielectric material, and the like) in order to increase the average "hardness" of a portion of a semiconductor device and reduce the degree of dishing of the portion of fill material during a CMP process. In some embodiments, dishing-resistant structures are added around circuit elements of a semiconductor device in order to reduce the amount of dishing around an entire perimeter of the circuit element of the semiconductor device. In some embodiments, a circuit element of the semiconductor device is a memory device. In some embodiments, the circuit element of the semiconductor device is a three-dimensional IC component. In some embodiments, the fill material is included as part of an interposer structure to be applied to an integrated circuit to facilitate forming connections to the integrated circuit.

In some embodiments, dishing resistant structures manufactured in fill material around circuit elements as described above include dummy structures, electrically isolated from the interconnect structure of a semiconductor device. In some embodiments, dishing resistant structures manufactured in fill material around circuit elements as described extend through a same depth of fill material as the circuit element in proximity to the dishing resistant structures. In some embodiments, the dishing resistant structures manufactured in fill material around circuit elements as described extend partly through the fill material, and are electrically isolated from a substrate material or base layer over which the circuit element has been manufactured.

FIG. 1 is a cross-sectional view of a semiconductor device 100, in accordance with some embodiments. In semiconductor device 100, circuit element 102 and circuit element 104 are over a substrate 101. In some embodiments, circuit elements of a semiconductor device include capacitors. In some embodiments, circuit elements of a semiconductor device include memory structures. In some embodiments, circuit elements of a semiconductor device include transistors, such as field effect transistors (FET), fin field effect transistor (FinFETS), gate-all-around (GAA) transistors or other three-dimensional integrated circuit (3DIC) elements.

Fill material 106 is between a sidewall of circuit element 102 and a sidewall of circuit element 104. Fill material 106 is in contact with substrate 101.

Dishing resistant (DR) structures 108 are located in fill material 106 and are in direct contact with substrate 101. In some embodiments, DR structures extend partway through fill material over substrate 101. DR structures 108 are pillars of a conductive material. In some embodiments, DR structures include pillars of metal, or dummy contacts, located in a fill material. In some embodiments, DR structures are bars of conductive material (bar structures, or bar-type DR structures) which extend into a fill material. A bar has one dimension, parallel to the top surface of the substrate 101, significantly longer than another dimension, parallel to the top surface of the substrate 101. A pillar has two dimensions parallel to the top surface of the substrate 101 that are approximately equal. In some embodiments, bar-shaped DR structures have a same width as a single pillar-type DR structure and have a length through the fill material equal to the length between two adjacent pillar-type DR structures in fill material. In some embodiments, DR structures extend partway through the fill material, and do not contact the substrate below the fill material.

In semiconductor device 100, a top surface of circuit element 102 and a top surface of circuit element 104 are a first distance D1 from a top surface of substrate 101. The DR structures 108 have a height H1 equal to the first distance D1. Fill material 106 has a thickness D2, where D2, H1 and D1 are substantially equivalent.

Figure 2:
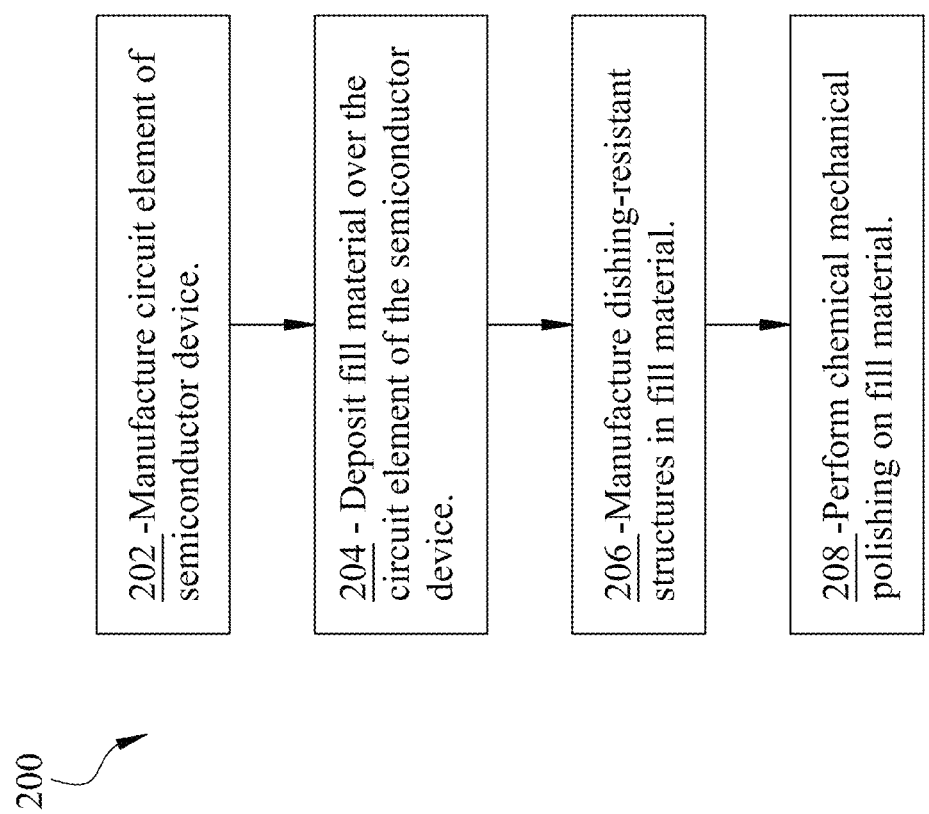
FIG. 2 is a flow diagram of a method of making a semiconductor device, in accordance with some embodiments.

FIG. 2 is a flow diagram of a method 200 of making a semiconductor device, in accordance with some embodiments.

Method 200 includes an operation 202 wherein a circuit element of a semiconductor device is manufactured over a substrate. In some embodiments, the circuit element includes a capacitor. In some embodiments, the circuit element includes a memory device. In some embodiments, the circuit element includes a transistor, such as a gate-all-around (GAA) transistor or other three-dimensional integrated circuit (3DIC) element. For purposes of clarity, the present disclosure describes a manufacturing process for a memory device in a semiconductor device. Non-limiting examples of a memory device at various stages of a manufacturing process are provided below in the descriptions of FIGS. 3A-3K. However, the method disclosed herein and dishing-resistant structures compatible with the method disclosed herein are suitable for use with a variety of circuit elements and are not limited by the particular embodiment provided herein.

Method 200 includes an operation 204 wherein the fill material is deposited over the circuit element, over the substrate, and in direct contact with sides of the circuit element. In some embodiments, the fill material includes a molding compound which has been deposited and cured over the top surface of the substrate. In some embodiments, fill material comprises low-k dielectric material having a dielectric constant smaller than the dielectric constant of silicon dioxide.

According to some embodiments, fill material is deposited by chemical vapor deposition (CVD) processes. According to some embodiments, fill material is deposited by a spin-type deposition process. In some embodiments, fill material is deposited by an atomic layer deposition (ALD) process.

Method 200 includes operation 206, wherein DR structures are manufactured in the fill material. In some embodiments, manufacturing DR structures includes performing a patterning process to form a set of openings in a layer of patterning material over the fill material. In some embodiments, manufacturing DR structures includes performing an etch process to form openings for the DR structures in the fill material. In some embodiments, manufacturing DR structures includes depositing a conductive material in the openings in the fill material. In some embodiments, the conductive material includes tungsten, titanium, cobalt, nickel, platinum, palladium, or another metal in the openings in the fill material. In some embodiments, manufacturing DR structures includes performing a CMP process to remove conductive material from the top of the fill material, forming isolated pillar structures or bar structures around the circuit element.

In some embodiments, manufacturing DR structures involves steps related to depositing a layer of patterning material over the top surface of the planarized fill material, transferring a pattern to the layer of patterning material using photolithography or some other patterning technology, and forming openings in the planarized fill material according to the pattern in the layer of patterning material. In some embodiments, manufacturing DR structures involves steps related to removing the layer of patterning material and depositing a conductive material in the openings formed in the layer of patterning material. Dishing of layers of material during CMP processes has a greater likelihood of occurring after the layers of material include contacts, vias, or conductive lines are manufactured in the semiconductor device, and a smaller likelihood of occurring before the layers of material include contacts, vias, or conductive lines. Thus, DR structures manufactured concurrently with contacts, vias, or conductive lines have a greater likelihood of reducing dishing across a surface of a semiconductor device and provide improved yield and performance results for the semiconductor device being manufactured.

Method 200 includes an operation 208 wherein a CMP process is performed on the layer of conductive material to expose a top surface of the fill material, isolating individual portions of conductive material in the openings formed in the layer of fill material. After performing operation 208, the semiconductor device is prepared for operations such as clean steps, deposition steps, or other patterning steps to manufacture the semiconductor device. By performing operation 208 subsequent to manufacturing DR structures in the layer of fill material, the open areas of fill material between circuit elements of the semiconductor device experience smaller amounts of dishing, or no dishing, based on the location of DR structures and the characteristics of the CMP process performed in operation 208.

By reducing dishing of the fill material during operation 208, DR structures provide for more uniform film thickness in subsequent deposition steps during manufacturing of the semiconductor device. Further, the semiconductor device experiences better focus during subsequent patterning steps and improved dimensional control of openings performed in subsequent etch steps because of more consistent etch times across a semiconductor device which are a result of the more uniform thickness of subsequent deposited layers of material.

FIGS. 3A-3K are perspective views of a memory device 300 during a manufacturing process, in accordance with some embodiments. A person of ordinary skill will understand that a variety of circuit elements in addition to the memory device 300 are also compatible with the method of manufacturing DR structures described herein.

Figure 3A:
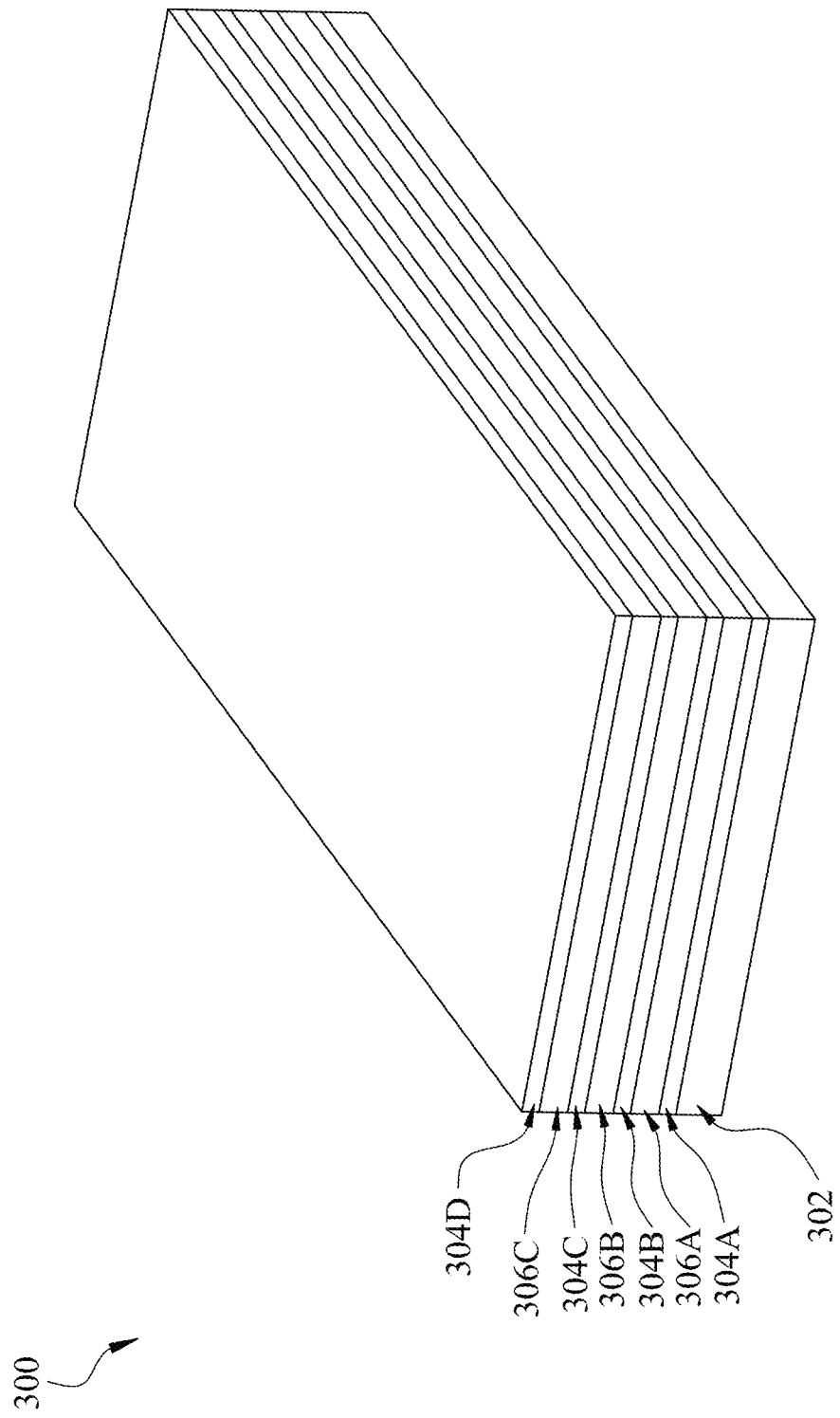
FIGS. 3A-3K are perspective views of a semiconductor device during a manufacturing process, in accordance with some embodiments.

In FIG. 3A, a plurality of layers of the memory device 300 have been deposited over substrate 302. The plurality of layers comprises alternating layers of a first dielectric material and a second dielectric material. In the present embodiment, the first dielectric material is an oxide layer. In some embodiments, the oxide layer comprises silicon dioxide or another oxide which is resistant to etch conditions for the second dielectric material. In the present embodiment, the second dielectric material is a nitride layer. In some embodiments, the nitride layer comprises silicon nitride, silicon oxy-nitride, or another nitride which is able to be removed selectively with respect to the first dielectric material. The second layer of dielectric material is a sacrificial dielectric material which is removed during a manufacturing process for the memory device described below.

The layer of first dielectric material 304A is deposited over substrate 302. In some embodiments, the first dielectric material includes a layer of silicon dioxide. In some embodiments, the layer of first dielectric material includes a low-k dielectric material. In some embodiments, the first layer of dielectric material is deposited by a chemical vapor deposition (CVD) process, an atomic layer deposition (ALD) process, or another process for adding dielectric material to a semiconductor device. The layer of second dielectric material 306A is deposited over layer of first dielectric material 304A. In some embodiments, the second dielectric material includes a layer of silicon nitride. In some embodiments, the layer of second dielectric material includes a silicon-oxy-nitride material. In some embodiments, the layer of first dielectric material and the layer of second dielectric material are distinguished by the etch rate of the dielectric material under certain process conditions, to promote removal of the layer of second dielectric material without significant removal of the layer of first dielectric material. In some embodiments, the second layer of dielectric material is deposited by a chemical vapor deposition (CVD) process, an atomic layer deposition (ALD) process, or another process for adding dielectric material to a semiconductor device. The layer of first dielectric material 304B is deposited over the layer of second dielectric material 306A. The layer of second dielectric material 306B is deposited over the layer of first dielectric material 304B. The layer of first dielectric material 304C is deposited over the layer of second dielectric material 306B. The layer of second dielectric material 306C is deposited over the layer of first dielectric material 304C. The layer of first dielectric material 304D is deposited over the layer of second dielectric material 306C. The number of layers in FIG. 3A is an example. In some embodiments, the number of layers is more or less than the number of layers in FIG. 3A.

Figure 3B:
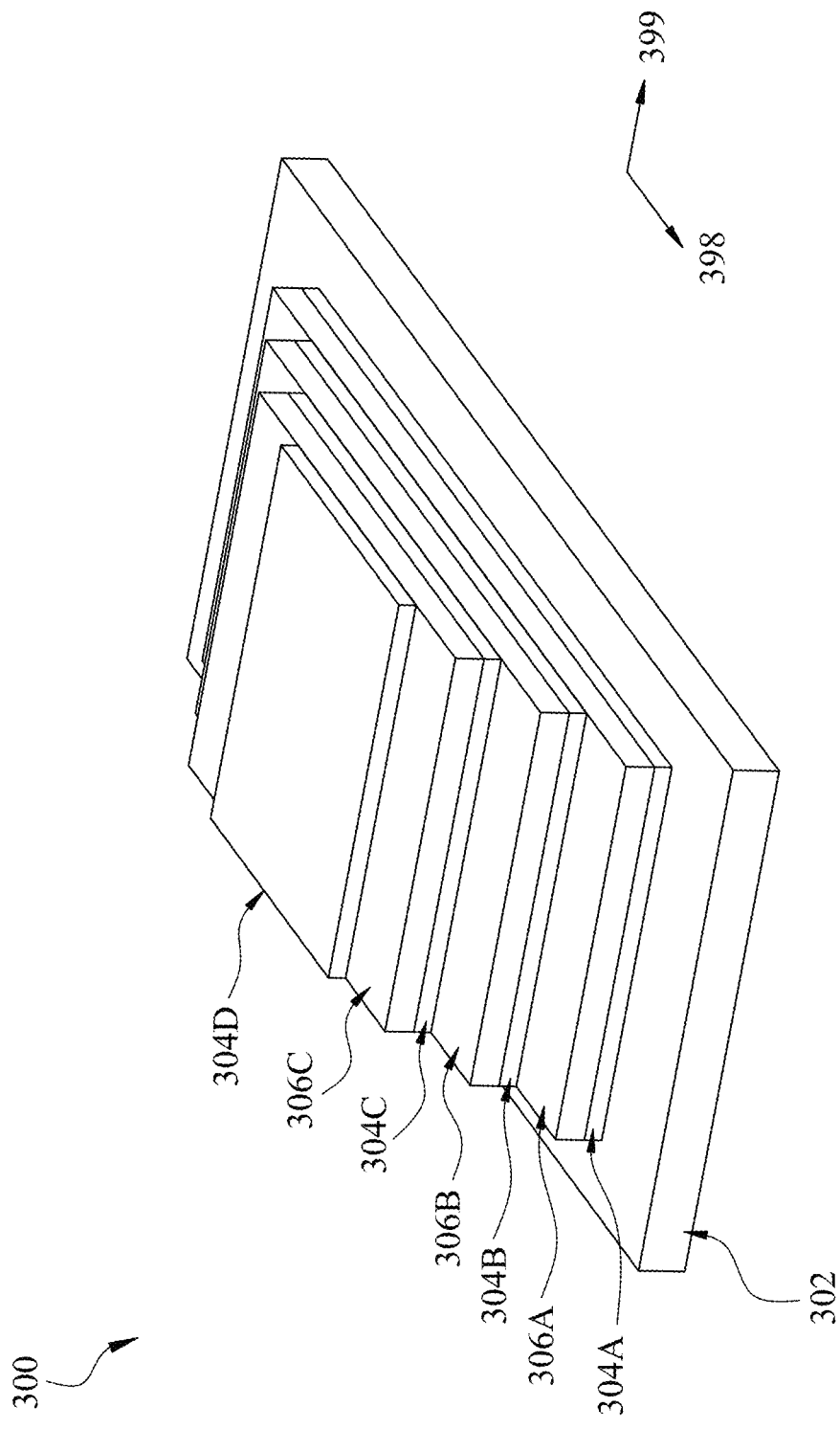

In FIG. 3B, the layers of first dielectric material and the layers of second dielectric material have been etched to form steps of the memory device, e.g., as described below. In some embodiments, the layers of first dielectric material and layers of second dielectric material are etched into steps by a plasma etch process through openings in a layer of temporary masking material. The layers of first dielectric material 304A-304D, and the layers of second dielectric material 306A-306C have been etched to expose a top surface of substrate 302 and to have aligned and parallel vertical edges along a direction 398 along the top surface of substrate 302.

The layer of first dielectric material 304A and the layer of second dielectric material 306A have been etched to have aligned vertical edges along a direction 399 along the top surface of substrate 302. The layer of first dielectric material 304B and the layer of second dielectric material 306B have been etched to have aligned vertical edges along a direction 399 along the top surface of substrate 302. The layer of first dielectric material 304C and the layer of second dielectric material 306C have been etched to have aligned vertical edges along a direction 399 along the top surface of substrate 302. The layer of dielectric material 304D has been etched to have a vertical edge extending along direction 399. In some embodiments, direction 398 is perpendicular to direction 399.

A top surface of layer of second dielectric material 306A is exposed above layer of first dielectric material 304A and beyond the vertical edges of layer of first dielectric material 304B and layer of second dielectric material 306B along direction 399. A top surface of layer of second dielectric material 306B is exposed above the layer of first dielectric material 304B and beyond the vertical edges of layer of first dielectric material 304C and layer of second dielectric material 306C along direction 399. A top surface of layer of second dielectric material 306C is exposed above layer of first dielectric material 304C and beyond the vertical edges of layer of first dielectric material 304D along direction 399.

Figure 3C:
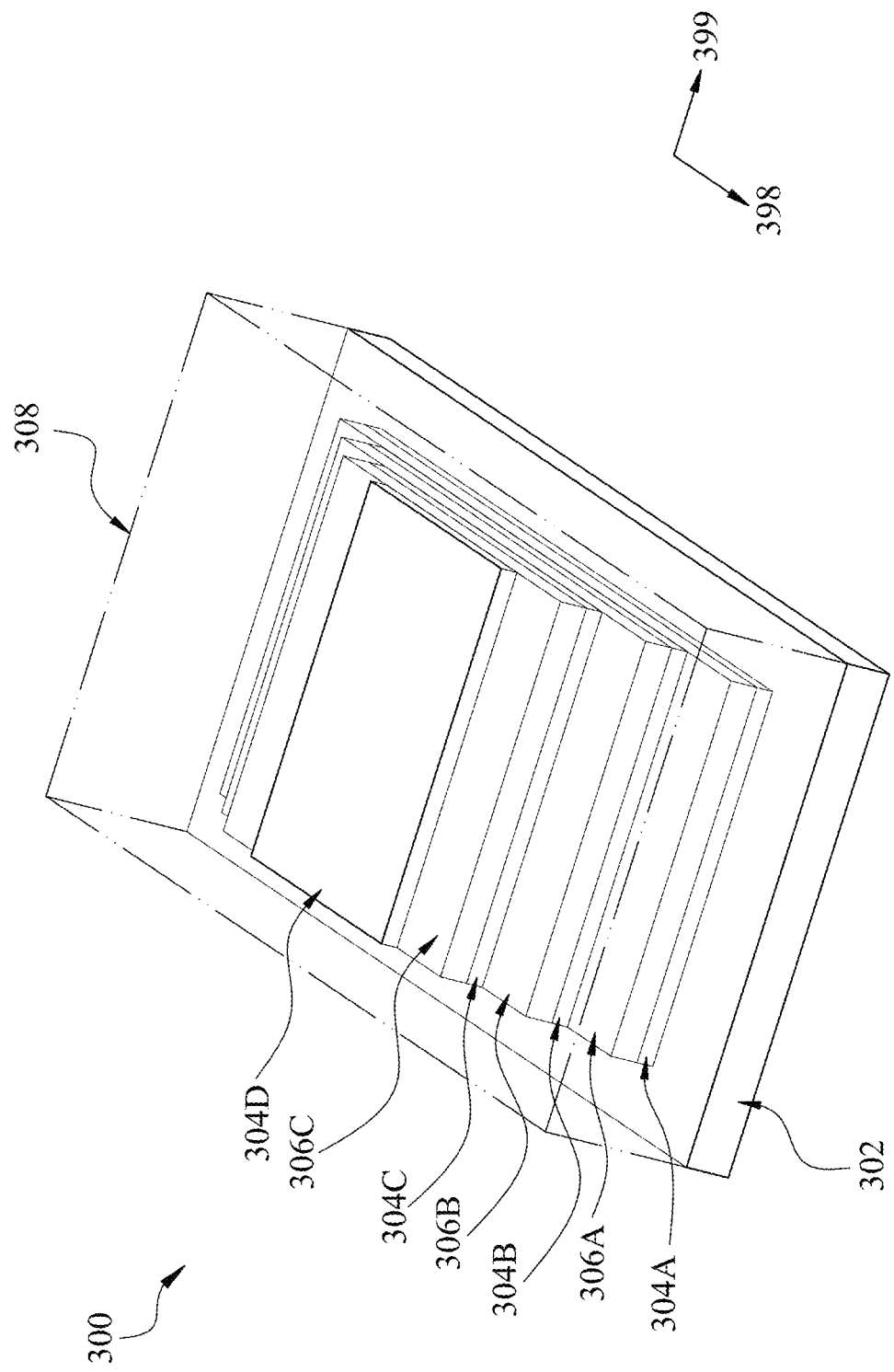

In FIG. 3C, a layer of fill material 308 has been deposited over the substrate 302 and the top surfaces of layer of second dielectric material 306A-306C. In some embodiments, depositing a layer of fill material includes performing a CVD process. In some embodiments, depositing a layer fill material includes performing a spin-on deposition process. A top surface of layer of first dielectric material 304D is not covered by fill material 308, e.g., a CMP process has been performed in order to expose the top surface of layer of first dielectric material 304D after deposition of fill material 308. In some embodiments, fill material includes a layer of silicon dioxide ($SiO_2$). In some embodiments, fill material includes a layer of spin-on glass. In some embodiments, the fill material includes a layer of boron-phosphorous spin on glass (BPSG). In some embodiments, the fill material includes a low-k dielectric material having a dielectric constant smaller than the dielectric constant of silicon dioxide ($SiO_2$).

Figure 3D:
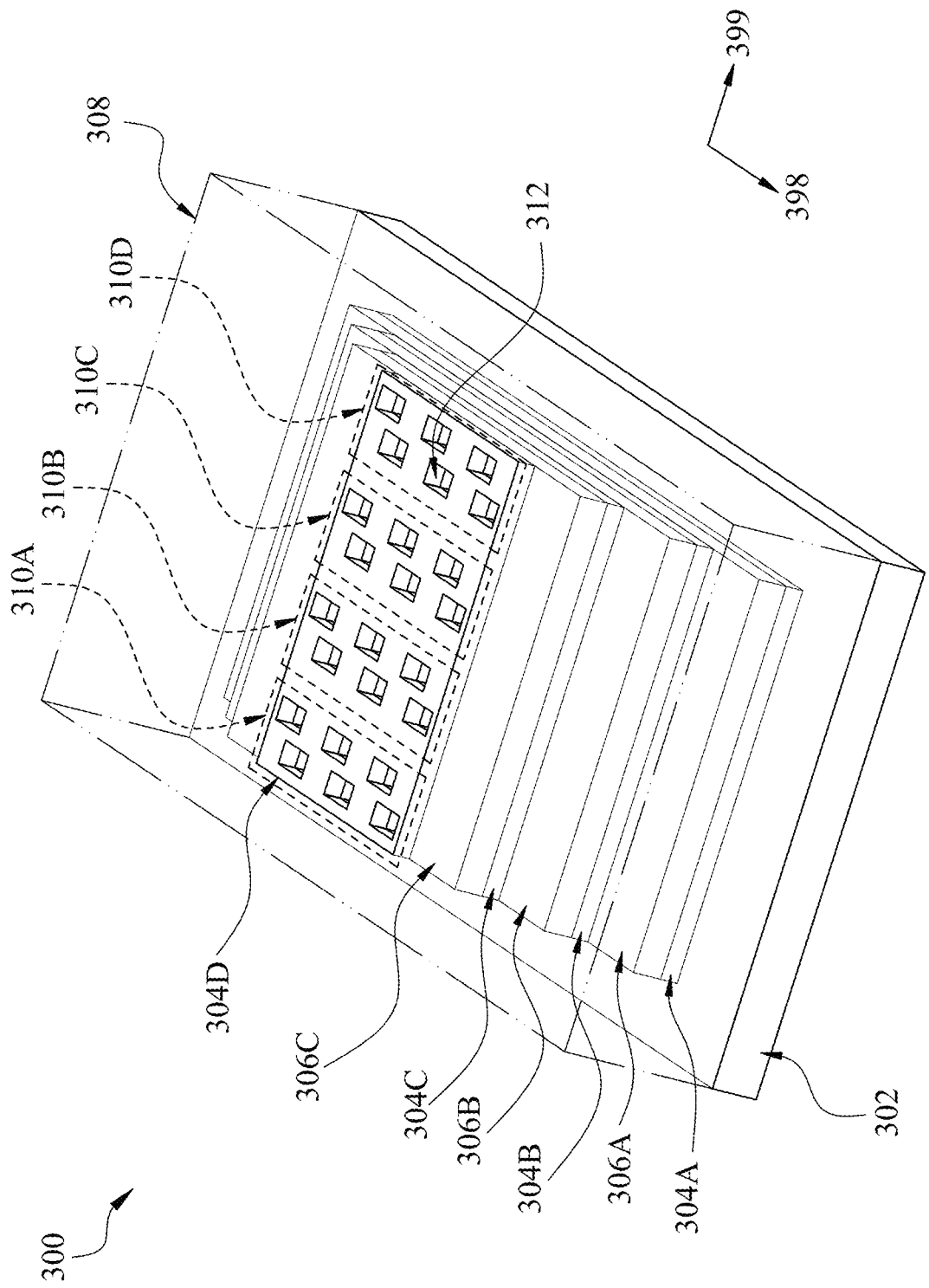

In FIG. 3D, memory device 300 has undergone an etch process wherein openings 312 have been formed through the layers of the first dielectric material 304A-304D, and the layers of second dielectric material 306A, 306B, and 306C within active area zones 310A, 310B, 310C, and 310D. In some embodiments, the etch process to form openings through the layers of first dielectric material and the layers of second dielectric material includes a plasma etch process to form contact structures. In some embodiments, the etch process changes chemistry at different stages of the etch process to etch different dielectric materials. Openings in the active area zones 310A, 310B, 310C, and 310D are at locations for the formation of channels for the memory device and deposition of charge storage material for the memory device.

Figure 3E:
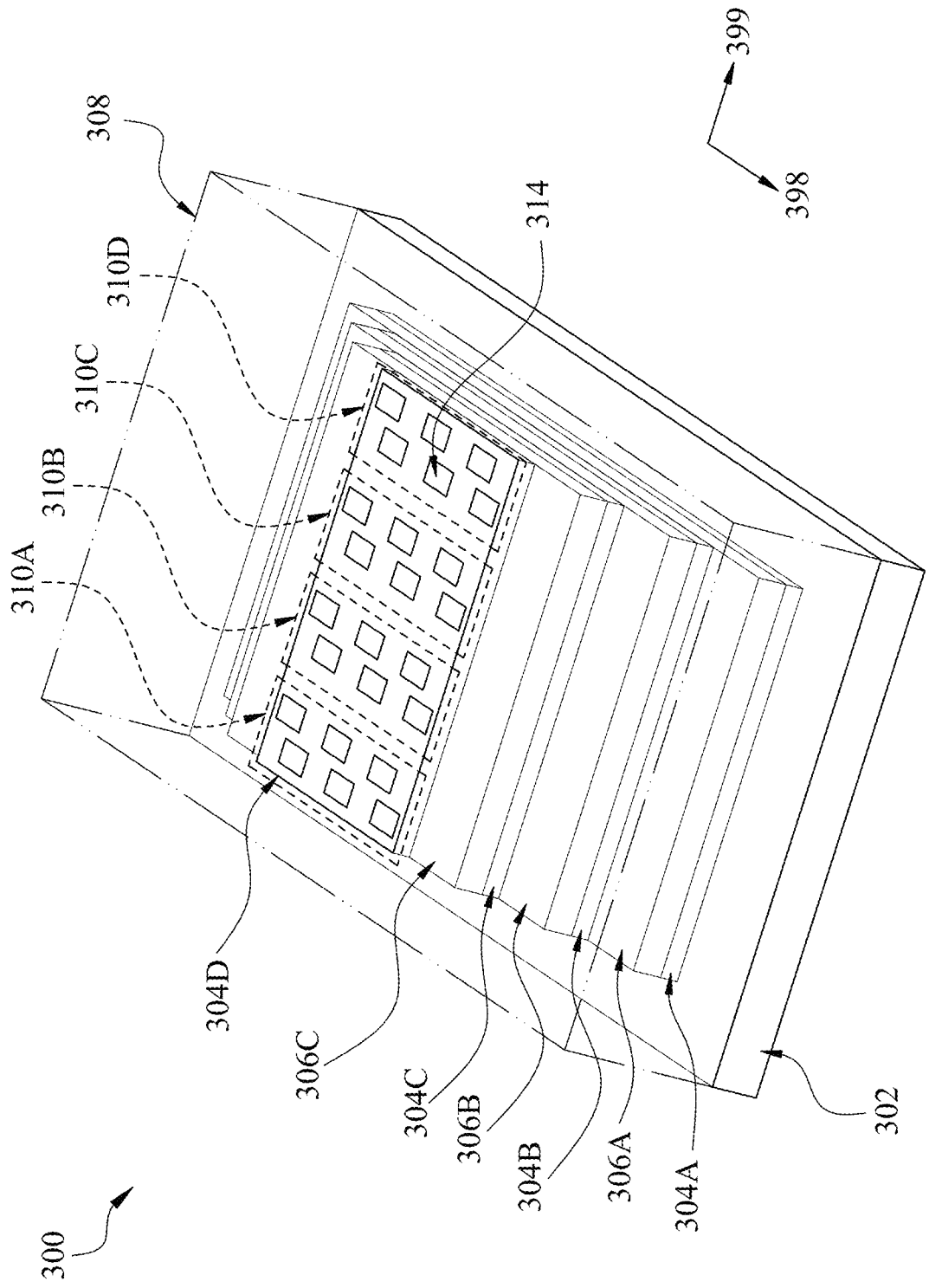

In FIG. 3E, memory device 300 has undergone a deposition process to form channel regions for the memory device within the openings described in FIG. 3D, and a deposition process wherein a layer of charge storage material 314 have been deposited in the openings described in FIG. 3D. According to some embodiments, the deposition process for forming a channel includes a CVD process, an ALD process, or an epitaxial deposition process which forms a layer of charge storage material for the memory device. In some embodiments, the charge storage material includes an ONO trilayer: a first oxide layer, a nitride layer, and a second oxide layer. In some embodiments, the first oxide layer and the second oxide layer include the same dielectric material. In some embodiments, the first oxide layer and the second oxide layer include different dielectric materials. The particular composition of an ONO trilayer is related to the structure of the memory device, and the selectivity which the ONO trilayer should exhibit during subsequent processing steps.

In some embodiments of memory devices, charge storage material comprises an ONO structure, e.g., a trilayer structure comprising a first deposited layer of oxide (O), such as silicon dioxide, a deposited layer of nitride, such as silicon nitride (N), and a second deposited layer of oxide (O). In some embodiments, the layers of the trilayer structure for charge storage material are deposited by a chemical vapor deposition (CVD) process, an atomic layer deposition (ALD) process, a combination thereof, or another deposition process known in the art.

In FIG. 3E, after deposition of the charge storage material, deposition of a channel material has also occurred (not shown), by deposition of a semiconductor material along portions of the openings in the active area zones 310A-310D. In some embodiments, the channel formation further comprises deposition of silicon, germanium, or another semiconductor material along sidewalls of the opening. In some embodiments, the channel formation is by atomic layer deposition or another suitable deposition technique to grow layers of channel material on the exposed portions of layers of second dielectric material within the openings.

In FIG. 3E, memory device 300 has also undergone a deposition process wherein dielectric material has been deposited in the openings etched in the active area zones 310A, 310B, 310C, and 310D to cover and protect the channels and the charge storage material previously deposited.

Figure 3F:
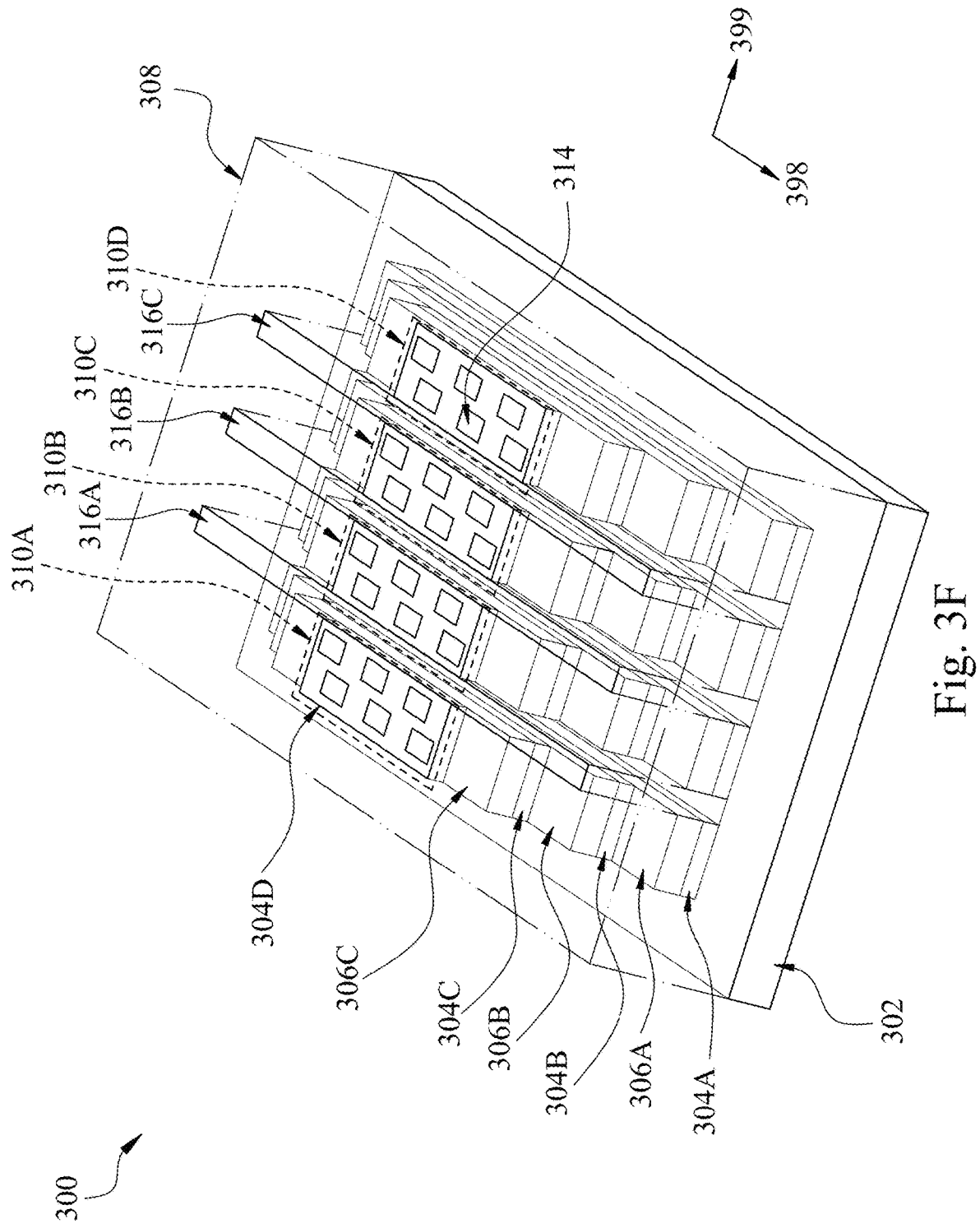

In FIG. 3F, memory device 300 has undergone an etch process which forms slits 316A, 316B, and 316C which extend along direction 398 through the stepped memory device structure. In some embodiments, an etch process which forms slits through a memory device includes steps with chemistry directed toward etching the layer of first dielectric material and the layer of second dielectric material, alternately, until the bottom-most layer of first dielectric material has been exposed in the slits thus formed. Slits 316A, 316B, and 316C expose sidewalls of the layers of second dielectric material 306A, 306B, and 306C, and the layers of first dielectric material 304A, 304B, 304C, and 304C. Slit 316A divides active area zone 310A from active area zone 310B. Slit 316B divides active area zone 310B from active area zone 310C. Slit 316C divides active area zone 310C from active area zone 310D.

Figure 3G:
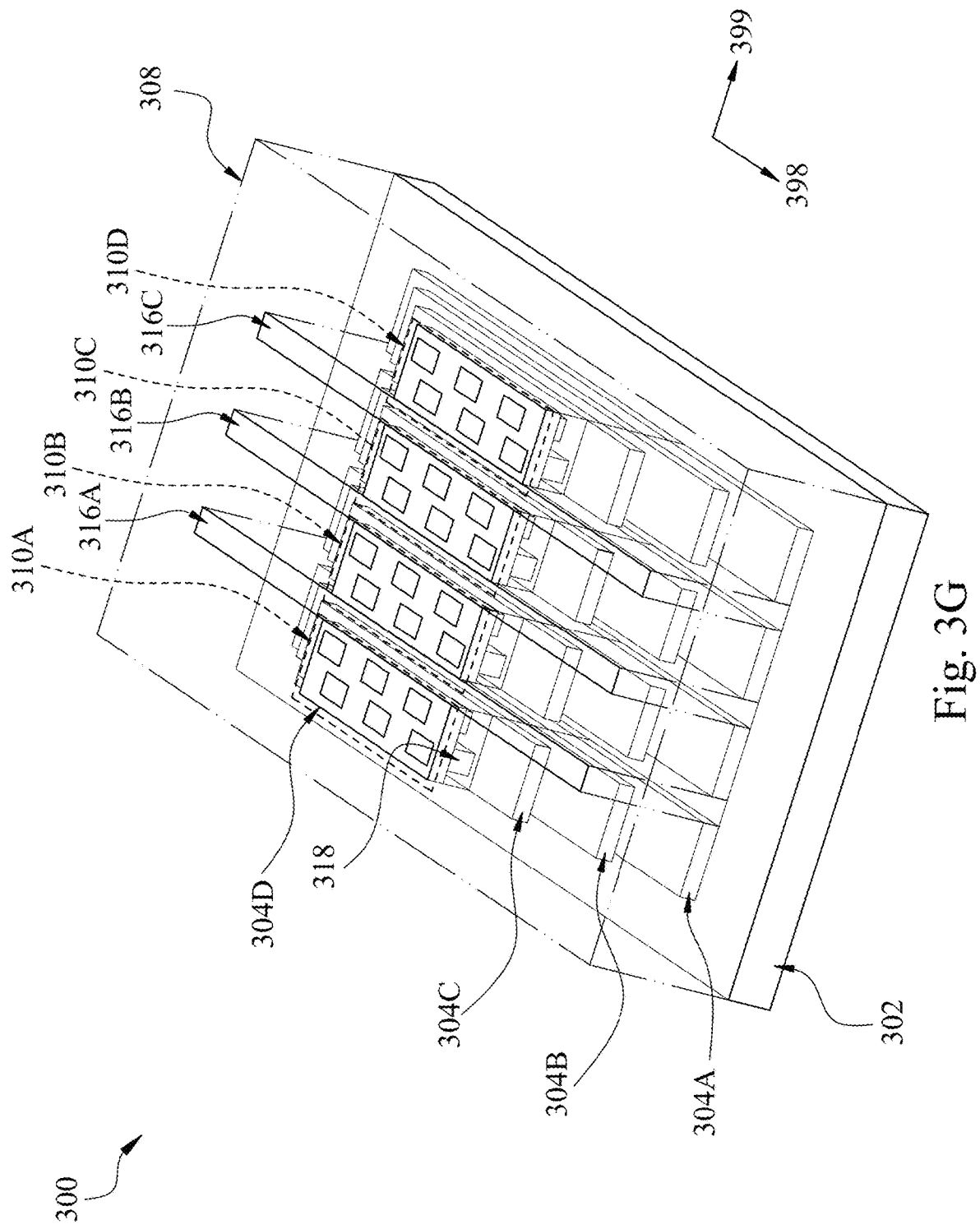

In FIG. 3G, memory device 300 has undergone an etch process whereby the layers of second semiconductor material 306A-306C have been removed from the stepped structure of the memory device. After the etch process has been performed, the charge storage material 318 of each memory cell in the active area zones 310A, 310B, 310C, and 310D is exposed to the slits 316A, 316B, and 316C. In some embodiments, the etch process to remove layers of second dielectric material 306A-306C is a liquid etch process which is highly selective for the removal of second oxide, using mixtures of sulfuric acid ($H_2SO_4$) and phosphoric acid ($H_3PO_4$).

Figure 3H:
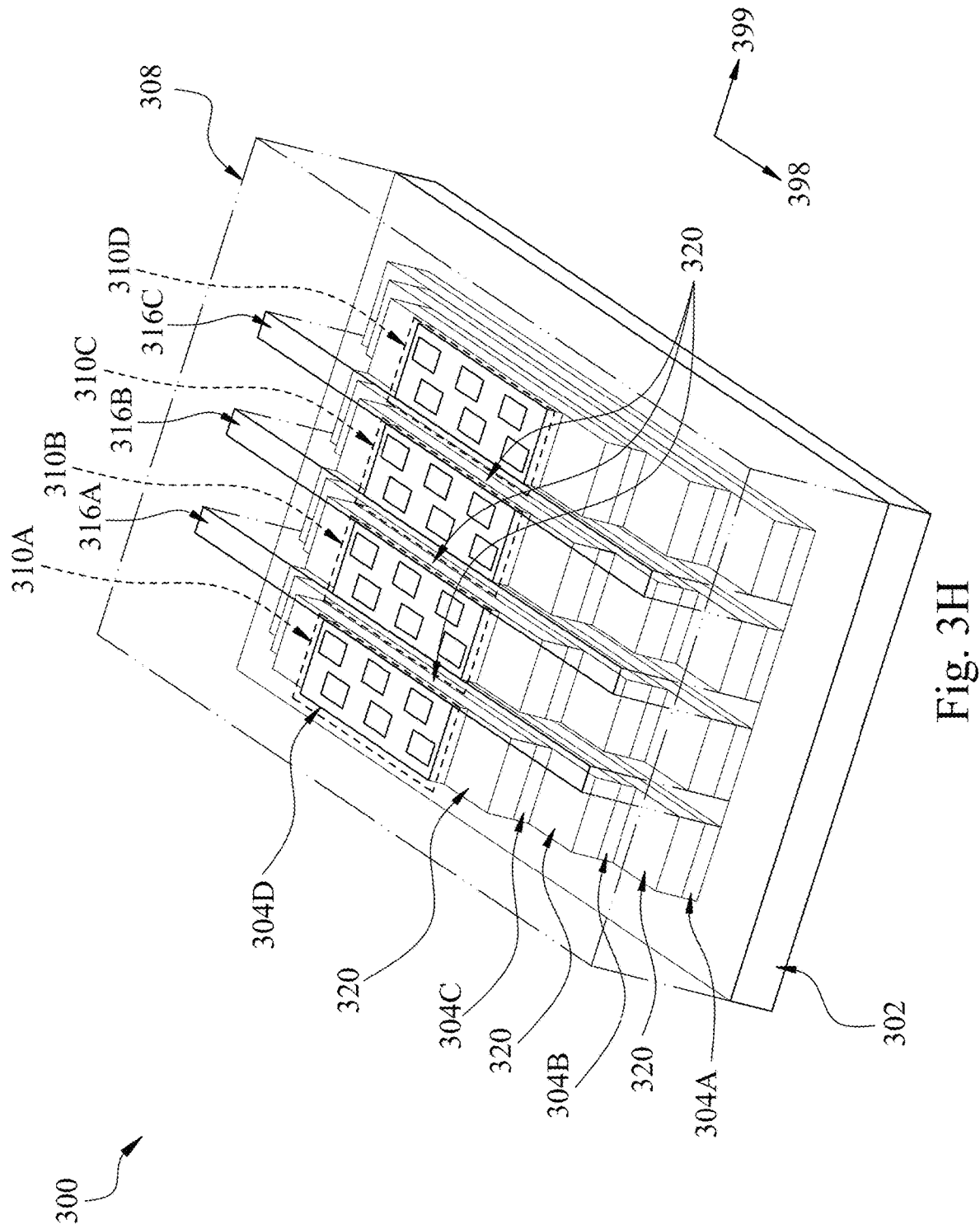

In FIG. 3H, memory device 300 has undergone a deposition process for a first conductive line. In some embodiments, the first conductive line includes a word line (WL). Conductive material 320 for the first conductive line has been deposited between the layers of first dielectric material 304A, 304B, 304C, and 304D. In some embodiments, the conductive material comprises a semiconductor material such as silicon, germanium, or another semiconductor material. In some embodiments, the word line material is doped with an N-type or a P-type dopant. In some embodiments, the conductive material is deposited by a CVD-type process, an ALD process, or another deposition process which provides for selective growth on the exposed surfaces of the layers of first dielectric material (e.g., the oxide layers, as described above). In some embodiments, the conductive material is a metal.

Figure 3I:
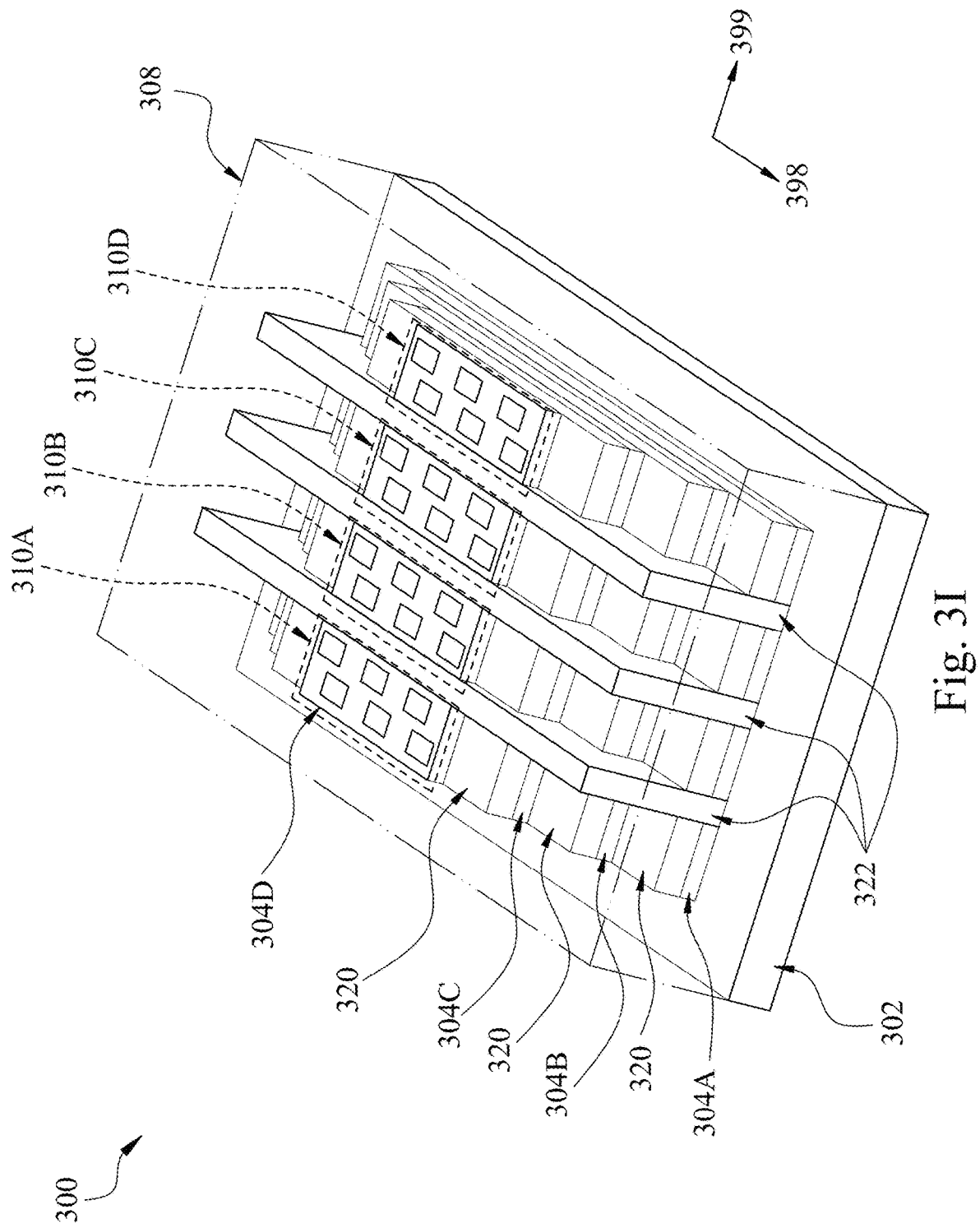
Figure 3J:
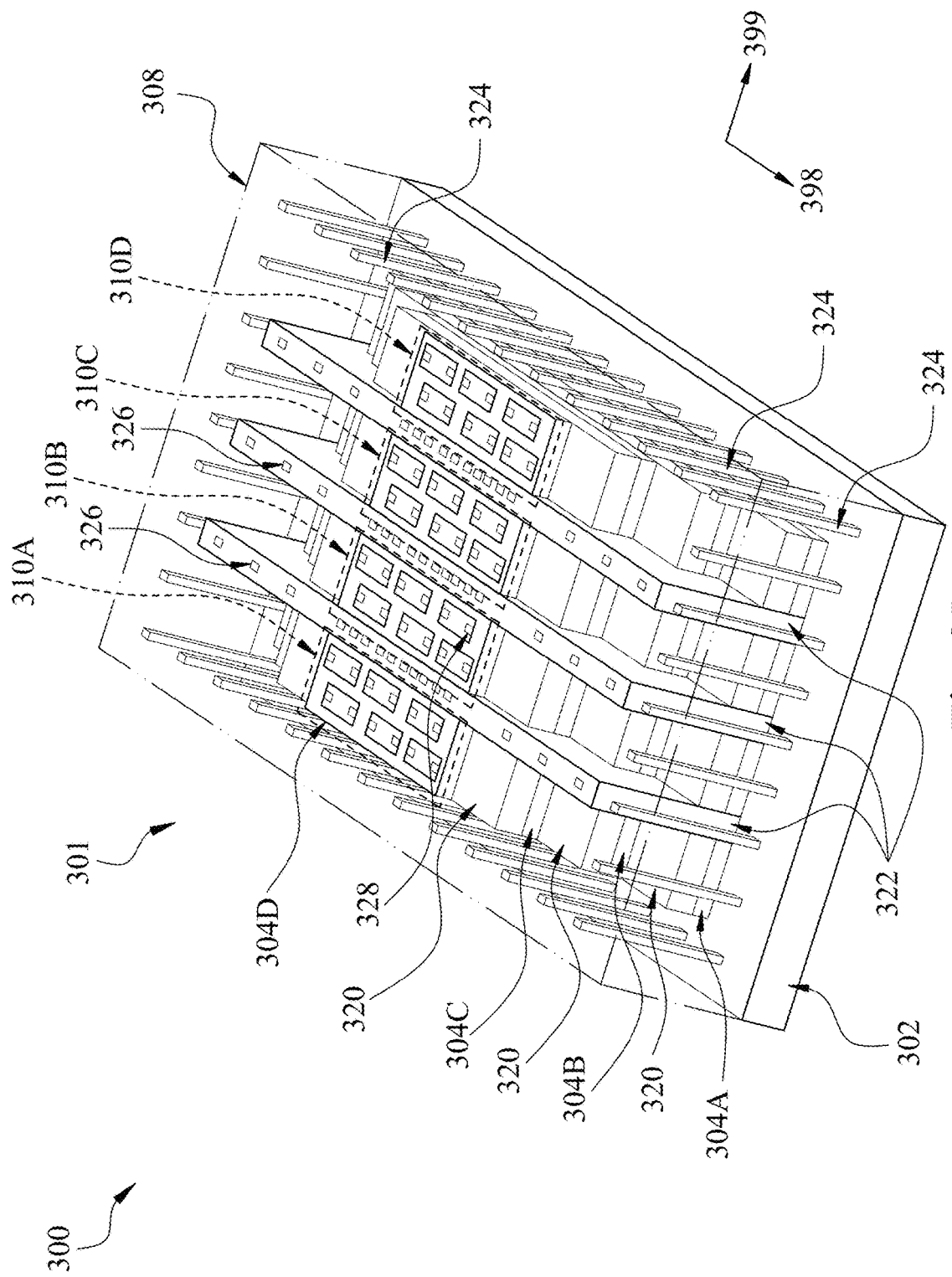

In FIG. 3I, memory device 300 has undergone a deposition process whereby dielectric material has been deposited into the slits 316A, 316B, and 316C between active area zones 310A, 310B, 310C, and 310D described above for FIG. 3G. In some embodiments, the dielectric material is silicon dioxide. In some embodiments, the dielectric material is a low-k dielectric material. In some embodiments, the dielectric material is a multi-layer stack of dielectric material which is configured to reduce parasitic capacitance between active area zones 310A, 310B, 310C, and 310D. In some embodiments, the dielectric material is deposited by a CVD process, an ALD process, or another process suitable for filling slits between the active area zones.

In FIG. 3I, memory device 300 has undergone a CMP process to expose the top surface of layer of first dielectric material 304D at the top of the memory device. The CMP process which exposes the top surface of layer of first dielectric material 304D prepares memory device 300 for the manufacture of dishing resistant structures In FIG. 3J, memory device 300 includes a reading contact 326 and source contacts 328 to memory device 301. Memory device 300 also includes DR structures 324 extending in a single row around or outside of a perimeter of the memory device. By manufacturing DR structures at the same time as the reading contacts 326 and source contacts 328, semiconductor device experiences reduced dishing after manufacturing the reading contacts 326 and source contacts 328 with no requirement for additional photomasks, pattern transfer processes, metal deposition processes, and/or clean operations during a manufacturing process. The integrated manufacturing of DR structures provides for reduced dishing in a semiconductor device on an as-needed basis, when the selecting contacts, reading contacts, and source contacts for the memory device modify the hardness of the semiconductor device in the region of the memory device.

Figure 3K:
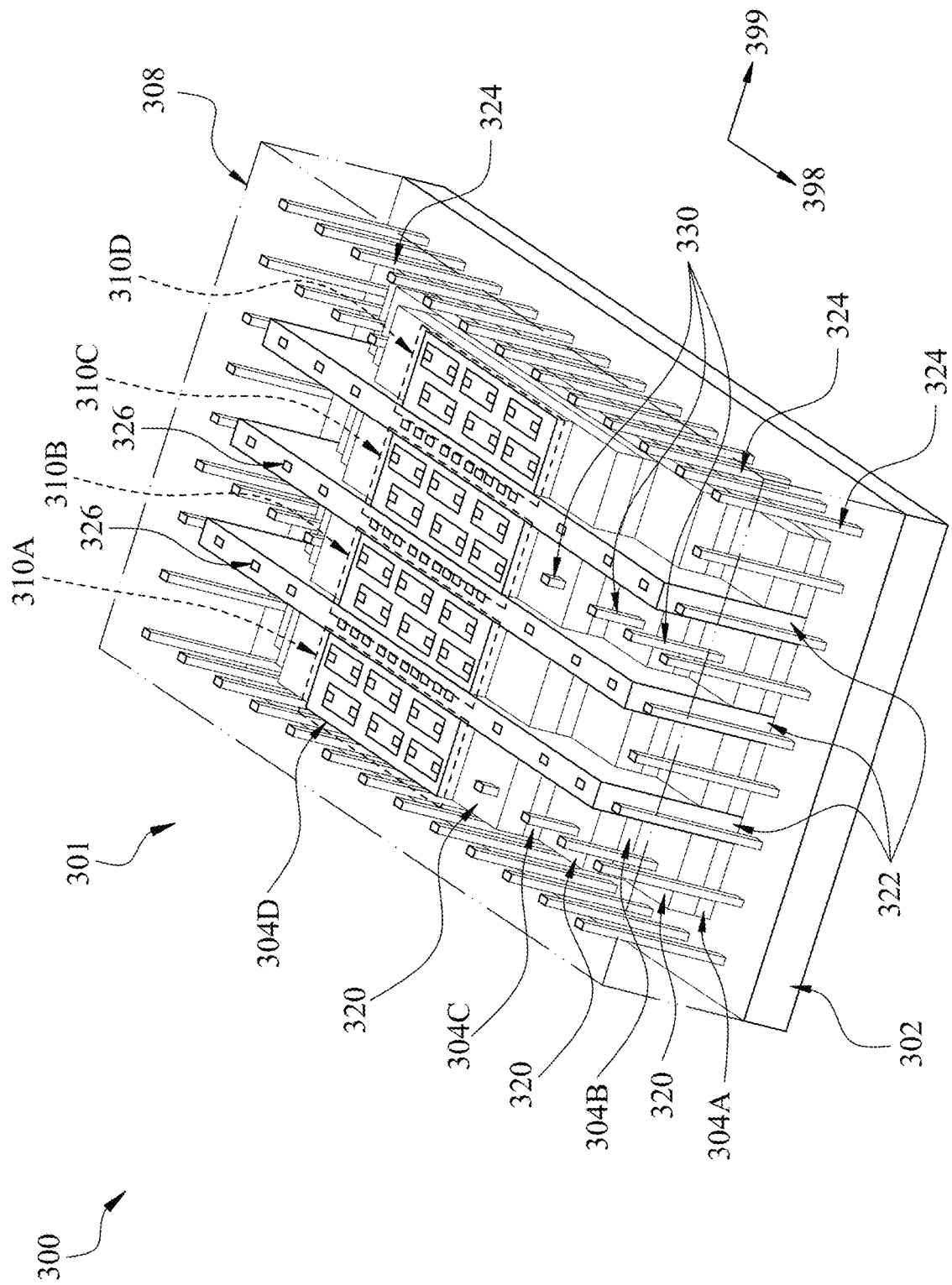

In FIG. 3K, semiconductor device 300 includes selecting contacts 330 which electrically connect to the conductive material 320 which is located between layers of the first dielectric material 304A, 304B, 304C, and 304C. In some embodiments, the material of the selecting contacts, the reading contacts, and the source contacts include the same conductive material. In some embodiments, the material of the selecting contacts, the reading contacts, and the source contacts include different conductive materials.

FIGS. 4A-4E are top views of semiconductor devices during a manufacturing process, in accordance with some embodiments.

FIG. 4A is a top view of a semiconductor device 400 having an arrangement of dishing-resistant structures, in accordance with some embodiments. In semiconductor device 400, circuit element 402 has a perimeter 403 and is surrounded by a row of DR structures 404. The individual DR structures of the row of DR structures 404 form a continuous path around the perimeter 403. The individual DR structures of the row of DR structures 404 comprise pillars located in the fill material 405 which laterally surrounds circuit element 402. In some embodiments, the individual DR structures of the row of DR structures extend through the fill material and have one end in direct contact with the substrate below the fill material. In some embodiments, the individual DR structures of the row of DR structures extend part-way through the layer of fill material and have one end entirely surrounded by fill material, while the opposite end of the individual DR structures is flush with the top surface of the fill material after performing a CMP process.

FIG. 4B is a top view of a semiconductor device 420 having an arrangement of dishing-resistant structures, in accordance with some embodiments. Elements of FIG. 4B which have a same function as a corresponding element of semiconductor device 400 have a same identifying numeral incremented by 20. Semiconductor device 420 includes a circuit element 422 which has a perimeter 423 and is surrounded by row of DR structures 424 and row of DR structures 426. Row of DR structures 424 forms a continuous path of individual DR structures extending around perimeter 423 of circuit element 422. Row of DR structures 424 is between circuit element 422 and row of DR structures 426. Row of DR structures 426 comprises a continuous path of individual DR structures around perimeter 423 and around row of DR structures 424. In semiconductor device 420, the individual DR structures of row of DR structures 424 and row of DR structures 426 comprise pillars of conductive material, as described above. Row of DR structures 424 and row of DR structures 426 are located in fill material 425 which extends laterally around circuit element 402.

For purposes of the present disclosure, a continuous row of DR structures is a set of individual DR structures arranged around a circuit element in a line, circle, or other regular arrangement of individual DR structures which has some fill material located between the individual DR structures of the continuous path. In some embodiments, an arrangement of individual DR structures comprises N continuous paths (lines circles, or other regular arrangements of individual DR structures) around the circuit element, where N ranges from 0 to 10. In some embodiments, N is greater than 10 and smaller than 100 continuous paths of individual DR structures around a circuit element of a semiconductor device.

FIG. 4C is a top view of a semiconductor device 440 having an arrangement of dishing-resistant structures, in accordance with some embodiments. Elements of semiconductor device 440 which have a same function as elements of semiconductor device 400 have a same identifying numeral incremented by 40.

In semiconductor device 440, circuit element 442 has a perimeter 443. Row of DR structures 444 extends around perimeter 443 and is located in fill material 445. Fill material 445 laterally surrounds and is in contact with sides of circuit element 442. Row of DR structures 446 extends around perimeter 443 and around row of DR structures 444 and is located in fill material 445.

Row of DR structures 444 comprises a set of pillars of conductive material in fill material 445. In some embodiments, individual pillars in a row of DR structures extends through the fill material and directly contacts the substrate below the fill material. In some embodiments, individual pillars in a row of DR structures extends part way through the fill material and is separated from the substrate by fill material.

Row of DR structures 446 comprises a set of bars of conductive material in fill material 445. In some embodiments, individual bars in a row of DR structures extends through the fill material and directly contacts the substrate below the fill material. In some embodiments, individual bars in a row of DR structures extends part way through the fill material and is separated from the substrate by fill material.

FIG. 4D is a top view of a semiconductor device 460 having an arrangement of dishing-resistant structures, in accordance with some embodiments. Elements of semiconductor device 460 which have a similar function to an element of semiconductor device 400 have a same identifying numeral incremented by 60.

In semiconductor device 460, circuit element 462 has a perimeter 463 and is laterally surrounded by fill material 465. Row of DR structures 464 extends around perimeter 463 in fill material 465 and comprises a continuous path of individual bar-type DR structures. Row of DR structures 466 extends around perimeter 463 and around row of DR structures 464 and comprises a continuous path of individual pillar-type DR structures.

In semiconductor device 460, row of DR structures 464 is at a first separation distance S1 from perimeter 463 at each side of circuit element 462. In semiconductor device 460, row of DR structures 466 is at a second separation distance S2 from row of DR structures 464 at each side of circuit element 462. In some embodiments, S1=S2. In some embodiments, S1<S2. In some embodiments, S1>S2. In some embodiments, the separation distance between a row of DR structures and the perimeter of a circuit element, or a different row of DR structures, is different at different sides of the circuit element.

Figure 4E:
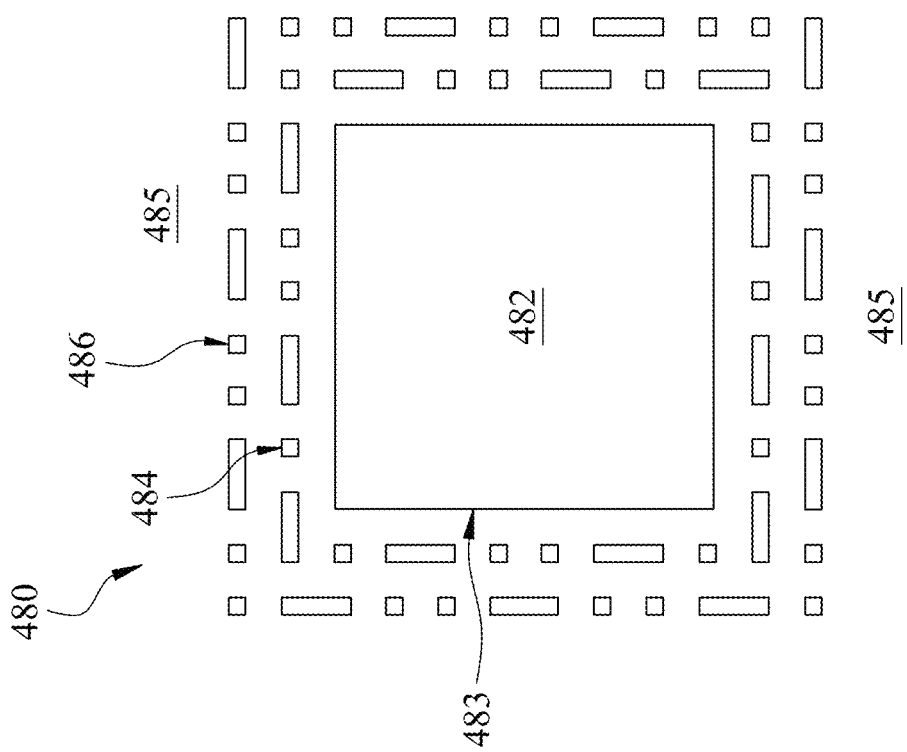

FIG. 4E is a top view of a semiconductor device 480 having an arrangement of dishing-resistant structures, in accordance with some embodiments. Elements of semiconductor device 480 which have a same function as elements of semiconductor device 400 have a same identifying numeral incremented by 80. Circuit element 482 has a perimeter 483. Fill material 485 extends laterally around circuit element 482 and is in contact with perimeter 483. Row of DR structures 484 is in fill material 485 and extends around perimeter 483 of circuit element 482. Row of DR structures 486 is in fill material 485 and extends around perimeter 483 of circuit element 482. Row of DR structures 484 and row of DR structures 486 each comprise a plurality of individual pillar-type DR structures and a plurality of individual bar-type DR structures. The individual DR structures of row of DR structures 484 form a continuous path around perimeter 483. The individual DR structures of row of DR structures 486 form a continuous path around perimeter 483 and around row of DR structures 484.

In some embodiments, the individual pillar-type DR structures and the individual bar-type DR structures alternate along a continuous path around a circuit element. In some embodiments, pairs of individual DR structures alternate along a continuous path around a circuit element. In some embodiments, other patterns of individual pillar-type DR structures and bar-type DR structures are organized along the continuous path around a circuit element to adjust spacing of the DR structures to reduce dishing around the circuit element according to empirical measurements taken during a test or manufacturing process for a semiconductor device.

Figure 5A:
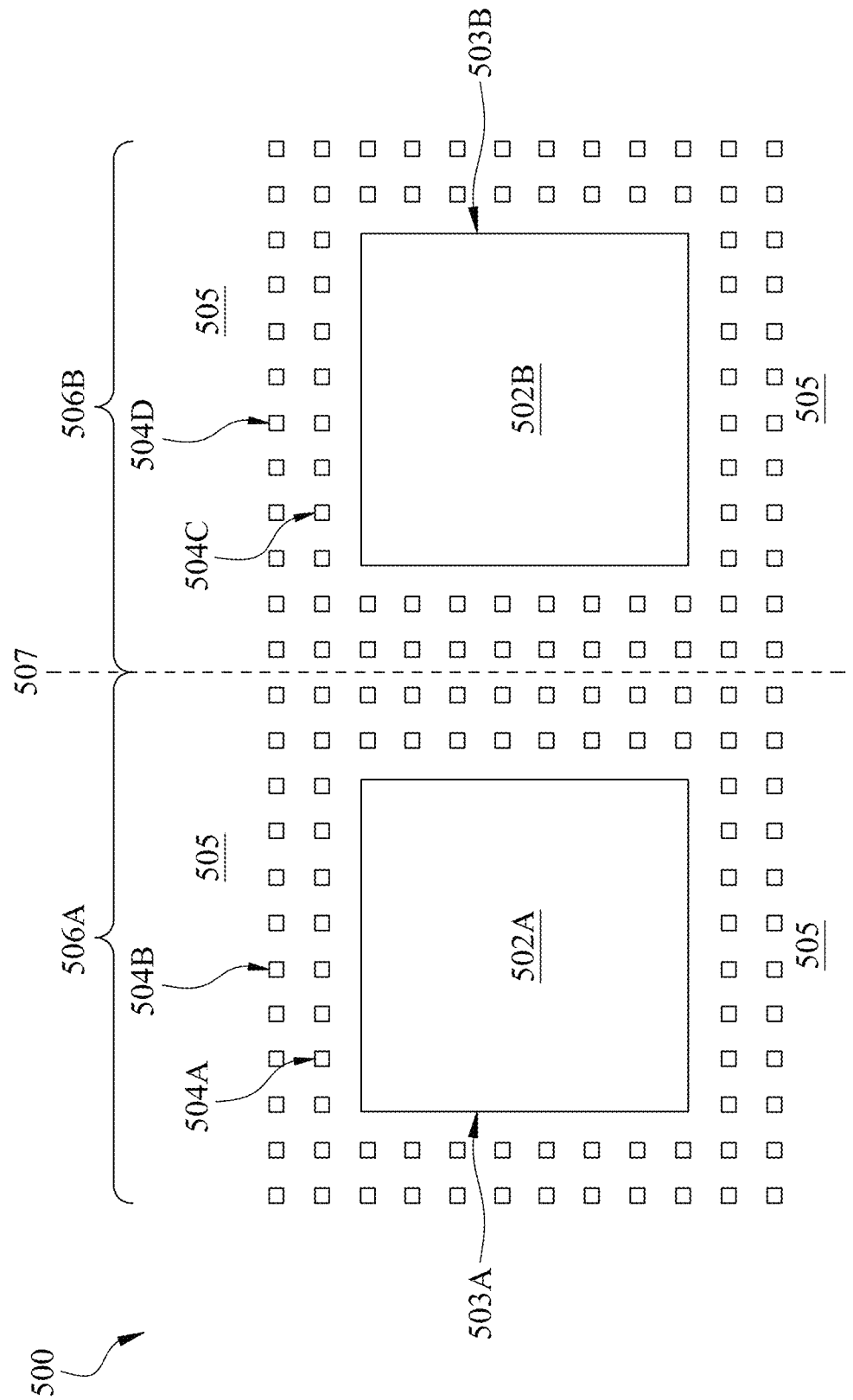

FIGS. 5A and 5B are top views of semiconductor devices during a manufacturing process, according to some embodiments.

In FIG. 5A, semiconductor device 500 includes a first circuit element 502A and a second circuit element 502B. First circuit element has a perimeter 503A which is surrounded by a first row of DR structures 504A, and a second row of DR structures 504B. A same number of rows of DR structures extend around perimeter 503A within the first circuit element area 506A. First circuit element area 506A includes the fill material 505 which extends around the perimeter 503A and laterally surrounds the DR structures of first row of DR structures 504A and second row of DR structures 505B.

A boundary line 507 separates first circuit element area 506A from second circuit element 506B, and extends between the side of first circuit element 502A proximal to second circuit element 502B and the side of second circuit element 502B proximal to first circuit element 502A.

Second circuit element area 506B includes second circuit element 502B. Second circuit element 502B has a perimeter 503B. Second circuit element 502B is laterally surrounded by fill material 505, third row of DR structures 504C and fourth row of DR structures 504D. The fill material 505 between first circuit element 502A and second circuit element 502B includes four rows of DR structures: first row of DR structures 504A and second row of DR structures 504B, which extend around first circuit element 502A, and third row of DR structures 504C and fourth row of DR structure 504D, which extend around second circuit element 502B. The fill material 505 around other sides of first circuit element 502A includes two rows of DR structures. In some embodiments, the number of rows of DR structures between two adjacent circuit elements includes the sum of the number of rows of DR structures around the first circuit element, and the number of rows of DR structures around the second circuit element.

In FIG. 5B, semiconductor device 520 includes a first circuit element 522A and a second circuit element 522B. Elements of semiconductor device 520 which have a same structure or function as an element of semiconductor device 500 have a same identifying numeral incremented by 20.

In semiconductor device 520, first circuit element area 526A includes a first row of DR structures 524A which extends around all four sides of perimeter 523A in the fill material 525. First circuit element area 526A includes a second row of DR structures 524B which extends around three sides of perimeter 523A in the fill material 525. Second row of DR structures 524B does not extend between first circuit element 522A and second circuit element 522B.

In semiconductor device 520, second circuit element area 526B includes a third row of DR structures 524C which extends around all four sides of perimeter 523B in the fill material 525. Second circuit element area 526B includes a fourth row of DR structures 524D which extends around three sides of perimeter 523B in the fill material 525. Fourth row of DR structures 524D does not extend between second circuit element 522B and first circuit element 522A. Thus, a same number of rows of DR structures is around each side of first circuit element 522A and each side of second circuit element 522B.

In some embodiments, the pitch of DR structures around the perimeter is a regular pitch, and the spacing between rows of DR structures is the same as the spacing between DR structures in a single row of DR structures around a circuit element. In some embodiments, the spacing between rows of DR structures is different than the spacing between DR structures in a single row of DR structures around a circuit element.

Aspects of the present disclosure relate to a semiconductor device which includes a first circuit element over a substrate; a fill material over the substrate and in contact with sides of the first circuit element; and a dishing resistant (DR) structure in the fill material and outside a perimeter of the first circuit element. In some embodiments, the first circuit element is a capacitor. In some embodiments, the first circuit element is a memory device. In some embodiments, the DR structure further includes a set of pillars of conductive material in the fill material. In some embodiments, the DR structure further includes a set of bar structures of conductive material in the fill material. In some embodiments, the DR structures are in direct contact with the substrate. In some embodiments, the set of DR structures is arranged into at least one row extending around the perimeter of the first circuit element.

Aspects of the present disclosure relate to a semiconductor device which includes a first circuit element embedded in a fill material over a substrate; a second circuit element embedded in the fill material over the substrate; a first arrangement of dishing resistant (DR) structures in the fill material in extending around a perimeter of the first circuit element; and a second arrangement of the DR structures in the fill material and extending around a perimeter of the second circuit element, wherein the first arrangement and the second arrangement include rows of DR structures. In some embodiments, the first arrangement includes a first number of rows of DR structures around the perimeter of the first circuit element; and the second arrangement includes the first number of rows of DR structures around the perimeter of the second circuit element. In some embodiments, the first arrangement includes a first number of rows of DR structures around the perimeter of the first circuit element; and the second arrangement includes a second number of rows of DR structures around the perimeter of the second circuit element, wherein the first number is different from the second number. In some embodiments, the first arrangement and the second arrangement include a first number of rows of DR structures between the first circuit element and the second circuit element; and a second number of rows of DR structures extending a remainder of the perimeter of the first circuit element and a remainder of the perimeter of the second circuit element, wherein the first number of rows is different from the second number of rows. In some embodiments, the first arrangement of DR structures and the second arrangement of DR structures further include pillars of conductive material. In some embodiments, the first arrangement of DR structures and the second arrangement of DR structures further include bars of conductive material. In some embodiments, the first arrangement of DR structures and the second arrangement of DR structures include alternating rows of pillars and bars of conductive material.

Aspects of the present disclosure relate to a method of making a semiconductor device which includes operations for manufacturing a circuit element of the semiconductor device over a substrate; depositing a fill material over the substrate and in contact with sides of the circuit element; etching the fill material to expose a top surface of the circuit element; and manufacturing dishing resistant (DR) structures in the fill material around a perimeter of the circuit element. In some embodiments, manufacturing a circuit element further includes manufacturing a capacitor. In some embodiments, manufacturing a circuit element further includes manufacturing a memory device. In some embodiments, depositing a fill material further includes depositing a layer of dielectric material. In some embodiments, manufacturing DR structures in the fill material further includes forming dummy contacts in the fill material. In some embodiments, forming dummy contacts in the fill material further includes: etching openings for the DR structures in the fill material; depositing a conductive material over a top surface of the fill material in the openings in the fill material; and etching the conductive material to expose a top surface of the fill material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first circuit element over a substrate, wherein the first circuit element comprises a conductive material extending across an entirety of the first circuit element in a direction parallel to a top surface of the substrate;
a fill material over the substrate and in contact with sides of the first circuit element; and
a dishing resistant (DR) structure in the fill material and outside a perimeter of the first circuit element, wherein the DR structure is a dummy structure, and a top-most surface of the DR structure is co-planar with a top-most surface of the conductive material.

2. The semiconductor device of claim 1, wherein the first circuit element comprises a capacitor.

3. The semiconductor device of claim 1, wherein the first circuit element comprises a memory device.

4. The semiconductor device of claim 1, wherein the DR structure comprises a set of pillars of conductive material in the fill material.

5. The semiconductor device of claim 1, wherein the DR structure comprises a set of bar structures of conductive material in the fill material.

6. The semiconductor device of claim 1, wherein the DR structure is in direct contact with the substrate.

7. The semiconductor device of claim 1, further comprising a set of DR structures arranged into at least one row extending around the perimeter of the first circuit element.

8. A semiconductor device comprising:
a substrate;
a fill material on the substrate;
a first circuit element embedded in the fill material, wherein the first circuit element comprises a conductive contact, and the conductive contact has a first height;
a second circuit element embedded in the fill material;
a first arrangement of dishing resistant (DR) structures in the fill material, wherein the first arrangement of DR structures extends around a perimeter of the first circuit element, a first DR structure of the first arrangement of DR structures has a second height greater than the first height, and a top-most surface of the conductive contact is co-planar with a top-most surface of the first DR structure; and
a second arrangement of the DR structures in the fill material and extending around a perimeter of the second circuit element, wherein the first arrangement comprises at least one row of DR structures and the second arrangement comprises at least one row of DR structures.

9. The semiconductor device of claim 8 wherein
the first arrangement comprises a first number of rows of DR structures around the perimeter of the first circuit element; and
the second arrangement comprises the first number of rows of DR structures around the perimeter of the second circuit element.

10. The semiconductor device of claim 8 wherein
the first arrangement comprises a first number of rows of DR structures around the perimeter of the first circuit element; and
the second arrangement comprises a second number of rows of DR structures around the perimeter of the second circuit element, wherein the first number is different from the second number.

11. The semiconductor device of claim 8 wherein the first arrangement and the second arrangement comprise
a first number of rows of DR structures between the first circuit element and the second circuit element; and
a second number of rows of DR structures extending a remainder of the perimeter of the first circuit element and a remainder of the perimeter of the second circuit element, wherein the first number of rows is different from the second number of rows.

12. The semiconductor device of claim 8 wherein the first arrangement of DR structures and the second arrangement of DR structures comprise pillars of conductive material.

13. The semiconductor device of claim 8 wherein the first arrangement of DR structures and the second arrangement of DR structures comprise bars of conductive material.

14. The semiconductor device of claim 8 wherein the first arrangement of DR structures and the second arrangement of DR structures comprise alternating rows of pillars and bars of conductive material.

15. A semiconductor device comprising:
 a fill material over a substrate;
 a first circuit element embedded in the fill material; and
 a plurality of dishing resistant (DR) structures embedded in the fill material, wherein the plurality of DR structures surrounds the first circuit element, and a first DR structure of the plurality of DR structures has a different dimension in a first direction from a second DR structure of the plurality of DR structures.

16. The semiconductor device of claim 15, wherein the first DR structure has a shorter dimension in the first direction than the second DR structure.

17. The semiconductor device of claim 16, wherein the first DR structure is between the first circuit element and the second DR structure.

18. The semiconductor device of claim 16, wherein the second DR structure is between the first circuit element and the first DR structure.

19. The semiconductor device of claim 15, wherein the plurality of DR structures is arranged in a plurality of concentric arrays.

20. The semiconductor device of claim 15, wherein the first DR structure is part of a first concentric array of the plurality of concentric arrays, and the second DR structure is part of a second concentric array of the plurality of concentric arrays.

* * * * *